US007323292B2

(12) United States Patent
Howard

(10) Patent No.: US 7,323,292 B2
(45) Date of Patent: Jan. 29, 2008

(54) PROCESS FOR USING PHOTO-DEFINABLE LAYERS IN THE MANUFACTURE OF SEMICONDUCTOR DEVICES AND RESULTING STRUCTURES OF SAME

(75) Inventor: Bradley J. Howard, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 138 days.

(21) Appl. No.: 10/702,238

(22) Filed: Nov. 6, 2003

(65) Prior Publication Data

US 2004/0101784 A1 May 27, 2004

Related U.S. Application Data

(62) Division of application No. 10/015,434, filed on Dec. 13, 2001, which is a division of application No. 09/146,263, filed on Sep. 3, 1998, now Pat. No. 6,350,706.

(51) Int. Cl.
*G03F 7/20* (2006.01)
*G03F 7/36* (2006.01)
*G03F 7/40* (2006.01)
*G03F 7/075* (2006.01)

(52) U.S. Cl. ............... 430/311; 430/325; 430/313; 430/317; 430/316; 430/318; 430/314; 430/5

(58) Field of Classification Search ........ 430/326, 430/313, 311, 319, 314, 315, 317
See application file for complete search history.

(56) References Cited

U.S. PATENT DOCUMENTS 4,921,321 A   5/1990   Weidman ............ 385/130

(Continued)

FOREIGN PATENT DOCUMENTS

GB   2 294 124 A   *  4/1996

OTHER PUBLICATIONS

Ajey M. Joshi et al., "Plasma Deposited Organosilicon Hydridge Network Polymers as Versatile Resists for Entirely Dry Mid-Deep UV Photolithography," *SPIE*, vol. 1925, pp. 709-720, Jan. 1993.
O. Joubert et al., "Plasma polymerized—dry resist process for 0.25 μm photolithography," *J. Vac. Sci. Technol.* B 12(6), pp. 3909-3913, Nov./Dec. 1994.

(Continued)

*Primary Examiner*—Sin Lee
(74) *Attorney, Agent, or Firm*—O'Keefe, Egan, Peterman & Enders, LLP

(57) ABSTRACT

A process and related structure are disclosed for using photo-definable layers that may be selectively converted to insulative materials in the manufacture of semiconductor devices, including for example dynamic random access memories (DRAMs), synchronous DRAMs (SDRAMs), static RAMs (SRAMs), FLASH memories, and other memory devices. One possible photo-definable material for use with the present invention is plasma polymerized methylsilane (PPMS), which may be selectively converted into photo-oxidized siloxane (PPMSO) through exposure to deep ultra-violet (DUV) radiation using standard photolithography techniques. According to the present invention, structures may be formed by converting exposed portions of a photo-definable layer to an insulative material and by using the non-exposed portions in a negative pattern scheme, or the exposed portions in a positive pattern scheme, to transfer a pattern into to an underlying layer. The remaining portions of the photo-definable layer may also be left as an insulator layer within the completed semiconductor device. Representative examples of structures which may be formed according to the present invention include, but are not limited to, dielectric layers, trenches for contacts, self-aligned contacts, conductors, insulators, capacitors, gates, source/drain junctions, and the like.

14 Claims, 10 Drawing Sheets

U.S. PATENT DOCUMENTS

| | | | |
|---|---|---|---|
| 4,978,594 A | 12/1990 | Bruce et al. | 430/14 |
| 5,215,861 A | 6/1993 | Augustino et al. | 430/270.1 |
| 5,439,780 A | 8/1995 | Joshi et al. | 430/296 |
| 5,885,751 A | 3/1999 | Weidman et al. | 430/315 |
| 6,127,263 A | 10/2000 | Parikh | 438/637 |
| 6,204,168 B1 * | 3/2001 | Naik et al. | 438/638 |
| 6,515,355 B1 * | 2/2003 | Jiang et al. | 257/678 |

OTHER PUBLICATIONS

O. Joubert et al., "Plasma Polymerized Organosilane Network Polymers; High Performance Resists for Positive and Negative Tone Deep UV Lithography," *SPIE*, vol. 2195, pp. 358-371, May 1994.

T. W. Weidman et al., Applications of Plasma Polymerized Methylsilane as a Resist and Silicon Dioxide Precursor for 193 and 248 nm Lithography, *SPIE*, vol. 2438, pp. 496-512, Jun. 1995.

Timothy W. Weidman and Ajey M. Joshi, "New photodefinable glass etch masks for entirely dry photolithography: Plasma deposited organosilicon hydride polymers," *Appl. Phys. Lett.* 62(4), pp. 372-374, Jan. 25, 1993.

* cited by examiner

PROCESS FOR USING PHOTO-DEFINABLE LAYERS IN THE MANUFACTURE OF SEMICONDUCTOR DEVICES AND RESULTING STRUCTURES OF SAME

This application is a division of application Ser. No. 10/015,434, filed Dec. 13, 2001 which is a division of application Ser. No. 09/146,263 filed Sep. 3, 1998, now U.S. Pat. No. 6,350,706, issued Feb. 26, 2002.

BACKGROUND OF INVENTION

This invention pertains to semiconductor processing techniques and more particularly to process techniques utilizing photo-definable layers to create desired structures for semiconductor devices.

The use of organic photoresist polymers as photo-definable mask layers in photolithography processes for the manufacture of semiconductor devices is well known. Typically, organic photoresist materials are used to form temporary surfaces that are removed after desired patterns have been transferred to a semiconductor substrate. The steps utilized to transfer a pattern to the semiconductor substrate often include coating a semiconductor wafer with a liquid organic photoresist layer, exposing the photoresist layer to a light source in a patterned manner, developing the photoresist layer with a liquid developer solution to remove unwanted portions of the photoresist layer, utilizing the remaining portions of the photoresist as an etch mask, and removing these remaining portions of the photoresist after the etch is completed.

It has been previously contemplated to utilize dry processing techniques for forming photo-definable layers to replace the liquid coating and developing steps used for traditional organic photoresists. Example materials that have been proposed for such dry processing techniques are organosilicon resists, such as plasma polymerized methylsilane (PPMS). Techniques for using PPMS as a photo-definable layer has been described in the following articles: Joubert et al., *Journal of Vacuum Science Technology*, B 12(6), pages 3909–3913 (November/December 1994); Weidman et al., *Applied Phys. Lett.*, 62(4), pages 372–374 (25 Jan. 1993) Joshi et al., *SPIE*, Volume 1925, pages 709–720 (Jan. 1993); Joubert et al., *SPIE*, Volume 2195, pages 358–371 (1994); Weidman et al., *SPIE*, Volume 2438, pages 496–512 (1995). With the techniques disclosed, a PPMS layer is deposited through a plasma reaction and exposed to deep ultraviolet (DUV) light in a patterned manner to convert the exposed regions of PPMS to a photo-oxidized siloxane called PPMSO. Next, the non-exposed PPMS portions may be removed, for example with a chlorine plasma etch, leaving the PPMSO portions as a hard mask layer for further processing.

SUMMARY OF INVENTION

The present invention provides novel and advantageous process techniques for using photo-definable layers in the manufacture of semiconductor devices, including the manufacture of dynamic random access memories (DRAMs), static RAMs (SRAMs), synchronous DRAMs (SDRAMs), FLASH memories, and other memory devices. In particular, the present invention contemplates the use of a photo-definable layer that may be converted into a insulative material and that may remain on a semiconductor structure as an integral component of that structure after the photolithography and etching process steps are completed. The invention, therefore, may serve to reduce the number of processing steps ordinarily required in a given operation due to use of the photo-definable layer.

In one embodiment, the present invention is a process for using a photo-definable layer in a positive mask scheme to manufacture a semiconductor device. This process may include forming a photo-definable layer that is convertible to an insulative material, exposing selected portions of the photo-definable layer to electro-magnetic radiation in a positive pattern scheme to convert the selected portions to an insulative material, removing exposed portions of the photo-definable layer, and using the non-exposed portions of the photo-definable layer as a patterned mask for further processing steps. In a further embodiment, the present invention is a semiconductor device including a substrate and at least one feature formed on the substrate by converting selected portions of a photo-definable layer to an insulative material through exposure to electro-magnetic radiation in a positive mask scheme and by using non-exposed portions of the photo-definable layer as a mask to form the one feature.

In another embodiment, the present invention is a process for etching an insulative layer using a photo-definable layer in a positive mask scheme. This process may include forming a photo-definable layer that is convertible to an insulative material, exposing selected portions of the photo-definable layer to electro-magnetic radiation in a positive pattern scheme to convert the selected portions to an insulative material, and removing exposed portions of the photo-definable layer and underlying portions of an insulative layer with a single-step etch process. In a further embodiment, the present invention is a patterned insulative structure within a semiconductor device including a substrate and a patterned insulative layer formed on the substrate by converting selected portions of a photo-definable layer to an insulative material through exposure to electro-magnetic radiation in a positive mask scheme and by using non-exposed portions of the photo-definable layer as a mask to form the patterned insulative layer.

In another embodiment, the present invention is a process for etching an insulative layer followed by a conductive layer in the manufacture of a semiconductor device. This process may include forming an insulative layer over a conductive layer on a substrate, forming a photo-definable layer that is convertible to an insulative material, exposing selected portions of the photo-definable layer to electro-magnetic radiation to convert the selected portions to an insulative material, removing exposed portions of the photo-definable layer and underlying portions of the insulative layer with a single-step etch process to form a void within the insulative layer, and removing a portion of the conductive layer within the void. In further embodiment, the present invention is a conductive interconnect structure within a semiconductor device including a substrate, a first conductive layer over the substrate, and an insulative layer over the conductive layer. This structure may further include a second conductive layer formed within a desired portion of the insulative layer to create a conductive interconnect structure connected to the first conductive layer. This second conductive layer may be formed by converting selected portions of a photo-definable layer to an insulative material through exposure to electro-magnetic radiation in a positive mask scheme, by using non-exposed portions of the photo-definable layer as a mask to form a pattern within the insulative layer, and by using non-exposed portions of the photo-definable layer as a sacrificial mask in etching the second conductive layer.

In yet another embodiment, the present invention is a process for using a photo-definable layer to underlie an organic photoresist layer during the manufacture of an integrated circuit structure is provided. This process may include forming a photo-definable layer that is convertible to an insulative material, creating a patterned organic photoresist layer over the photo-definable layer to leave unmasked portions of the photo-definable layer, exposing selected portions of the photo-definable layer to electro-magnetic radiation to convert the selected portions to an insulative material, and removing exposed portions of the photo-definable layer and underlying portions of the insulative layer with an etch process to form a void within the insulative layer. In a further embodiment, the present invention is a patterned insulative structure including a substrate and an insulative layer on the substrate formed by covering a photo-definable layer with a patterned organic photoresist, by converting unmasked portions of a photo-definable layer to an insulative material through exposure to electro-magnetic radiation in a positive mask scheme, and by using non-exposed portions of the photo-definable layer and the organic photoresist as a mask to form a pattern within the insulative layer.

In a still further embodiment, the present invention is a process for using a photo-definable layer including forming a photo-definable layer that is convertible to an insulative material, exposing selected portions of said photo-definable layer to electro-magnetic radiation in a negative pattern scheme to convert the selected portions to an insulative material, removing non-exposed portions of the photo-definable layer with an etch process, using the exposed portions of the photo-definable layer as a patterned mask for further processing steps, and leaving the exposed portions of the photo-definable layer as an insulative layer within the device. In a further embodiment, the present invention is a semiconductor device including a substrate and at least one feature formed on the substrate by converting selected portions of a photo-definable layer to an insulative material through exposure to electro-magnetic radiation in a negative mask scheme, by using exposed portions of the photo-definable layer as a mask to form at least one feature, and by leaving the exposed portions of the photo-definable layer on the substrate as an insulative layer.

In another embodiment, the present invention is a process for forming a self-aligned contact during the manufacture of a semiconductor device using a photo-definable layer in a positive mask scheme. This process may include forming an insulative layer over a substrate having at least two spaced structures, forming over the insulative layer a photo-definable layer that is convertible to an insulative material, exposing selected portions of the photo-definable layer to electro-magnetic radiation in a negative pattern scheme to convert the selected portions to an insulative material, and removing non-exposed portions of the photo-definable layer with an etch process to expose selected portions of the insulative layer between the spaced structures. The process may also include removing the selected portions of the insulative layer to expose underlying portions of the substrate and depositing conductive material to form a self-aligned contact between the spaced structures. In a further embodiment, the present invention may be a self-aligned contact structure within a semiconductor device formed using a photo-definable layer in a negative mask scheme. This structure may include a substrate, an insulative layer formed on the substrate, and at least one self-aligned contact formed on the substrate by converting selected portions of a photo-definable layer to an insulative material through exposure to electro-magnetic radiation in a negative mask scheme and by using exposed portions of the photo-definable layer as a mask to form at least one self-aligned contact.

In yet a further embodiment, the present invention is a process for using a photo-definable layer in a Damascene process to create a patterned structure. This process may include forming a photo-definable layer that is convertible to an insulative material, exposing selected portions of the photo-definable layer to electro-magnetic radiation to convert the selected portions to an insulative material, removing non-exposed portions of the photo-definable layer with an etch process to form a desired pattern within the exposed portions of the photo-definable layer, and leaving the exposed portions of the photo-definable layer on the substrate as an insulative layer. In a further embodiment, the present invention is a conductive interconnect structure including a substrate, and a patterned insulative layer on the substrate formed by converting selected portions of a photo-definable layer to an insulative material through exposure to electro-magnetic radiation in a negative mask scheme, by removing non-exposed portions of the photo-definable layer to form a pattern within the photo-definable layer, and by leaving the exposed portions of the photo-definable layer as the patterned insulative layer. Additionally, this structure may include a conductive layer inlaid within the patterned insulative layer.

In another embodiment, the present invention is a process for using a photo-definable layer in a dual Damascene process to create a patterned structure. This process may include forming a first photo-definable layer that is convertible to an insulative material and exposing selected portions of the first photo-definable layer to electro-magnetic radiation to convert the selected portions to an insulative material to define desired contact areas. The process may also include forming a second photo-definable layer that is convertible to an insulative material, exposing selected portions of the second photo-definable layer to electro-magnetic radiation to convert the selected portions to an insulative material to define a desired interconnect pattern, and removing non-exposed portions of the first and second photo-definable layers to form voids exposing the desired contact areas and the desired interconnect pattern. In a further embodiment, the present invention is a conductive interconnect structure including a substrate, a first conductive layer on the substrate, and a patterned insulative layer on the first conductive layer formed by converting selected portions of a photo-definable layer to an insulative material through exposure to electro-magnetic radiation in a negative mask scheme, by removing non-exposed portions of the photo-definable layer to form a pattern within the photo-definable layer, and by leaving the exposed portions of the photo-definable layer as the patterned insulative layer. This structure may further include a second conductive layer inlaid within the insulative layer forming contacts with selected portions of the first conductive layer.

BRIEF DESCRIPTION OF THE DRAWINGS

It is to be noted that the appended drawings illustrate only particular embodiments of the invention and are, therefore, not to be considered limiting of its scope, for the invention may admit to other effective embodiments.

DETAILED DESCRIPTION OF THE INVENTION

Figure 1A:
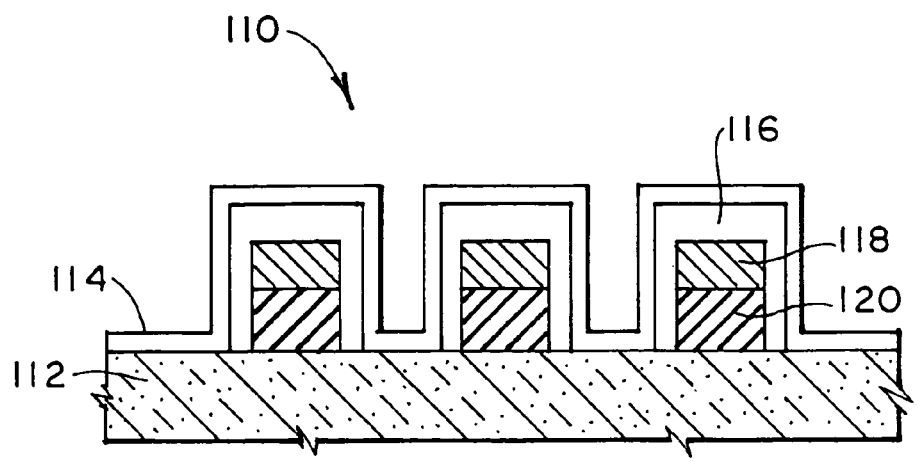
FIGS. 1a–1e show a sequence of structures in accordance with this invention culminating in a representative structure having a self-aligned contact.

The present disclosure provides novel and advantageous process for using a photo-definable layer that may be converted into a permanent insulative material in the preparation of a wide variety of structures in the manufacture of semiconductor devices. According to the present invention, the photo-definable layer may be used as both a positive or a negative pattern scheme. Representative examples of structures which may be formed according to the present invention include, but are not limited to, dielectric layers, trenches for contacts, self-aligned contacts, conductors, insulators, capacitors, gates, source/drain junctions, and the like, which can be used in the manufacture of integrated circuits including semiconductor memory devices, such as dynamic random access memories (DRAMs), static RAMs (SRAMs), synchronous DRAMs (SDRAMs), FLASH memories, and other memory devices.

As contemplated by the present invention, the photo-definable layer may be any material that is capable of being selectively converted to an insulative material, for example when irradiated with electro-magnetic radiation, including ultra-violet (UV) radiation, deep ultraviolet (DUV) radiation, or X-ray radiation. A representative example of materials that may be used for such photo-definable layers are organosilicon resists, including for example plasma polymerized methylsilane (PPMS). Such materials are described in Joubert et al., *Journal of Vacuum Science Technology*, B 12(6), pages 3909–3913 (November/December 1994); Weidman et al., *Applied Phys. Lett.*, 62(4), pages 372–374 (25 Jan. 1993); Joshi et al., *SPIE*, Volume 1925, pages 709–720 (Jan. 1993); Joubert et al., *SPIE*, Volume 2195, pages 358–371 (1994); Weidman et al., *SPIE*, Volume 2438, pages 496–512 (1995).

Additional representative examples of materials that may be used include the polysilynes disclosed in U.S. Pat. No. 4,921,321 and the silicon polymers disclosed in U.S. Pat. No. 5,439,780. As discussed in U.S. Pat. No. 4,921,321, photo-definable layers from polysilynes may be formed by spin-coating these materials onto a substrate in the presence of toluene followed by a reaction of $RSiCl_3$ with a NaK alloy. As discussed in U.S. Pat. No. 5,439,780, photo-definable layers from silicon polymers may be formed by plasma deposition of $RSiH_3$ in a gas phase that forms silicon polymers having the formula $R_xSi\ H_y$ and containing Si—$(Si)_n$—Si linkages. U.S. Pat. No. 4,921,321 and U.S. Pat. No. 5,439,780 are hereby incorporated herein by reference in their entirety.

Example structures that may be formed and process steps involved are shown in FIGS. 1a–e, 2a–d, 3a–d, 4a–c, 5a–e, 6a–f, and 7a–d. These example methylsilane (PPMS) as the material with which to form the photo-definable layer. FIGS. 1a–e, 4a–c, 5a–e and 6a–f depict process steps in which exposed PPMSO portions are used as a patterned mask for further processing steps. FIGS. 2a–d, 3a–d and 7a–d depict process steps in which non-exposed PPMS portions are used as a patterned mask for further processing steps. Although these examples use PPMS to form the photo-definable layer, it is understood that other photo-definable layers may be used as desired, with corresponding modifications to process steps depending upon the particular material chosen.

FIGS. 1a–e show process steps according to the present invention for forming self-aligned contacts, for example self-aligned contacts between transistor gate structures in a DRAM memory cell array. Referring to FIG. 1a, structure 110 is depicted that includes a substrate 112 upon which three transistor gate structures have been formed. Each of the three gate structures may include a polysilicon layer 120 formed on top of substrate 112 and a tungsten silicide layer 118 formed on top of the polysilicon layer 120. Substrate 112 may be a silicon wafer and may include any desired additional intervening layers formed in other process steps. Insulative layer 116 may be a silicon oxide layer formed over the gate structures. A second insulative layer 114, for example an oxide or nitride layer, may be formed on top of the oxide layer 116.

Figure 1B:
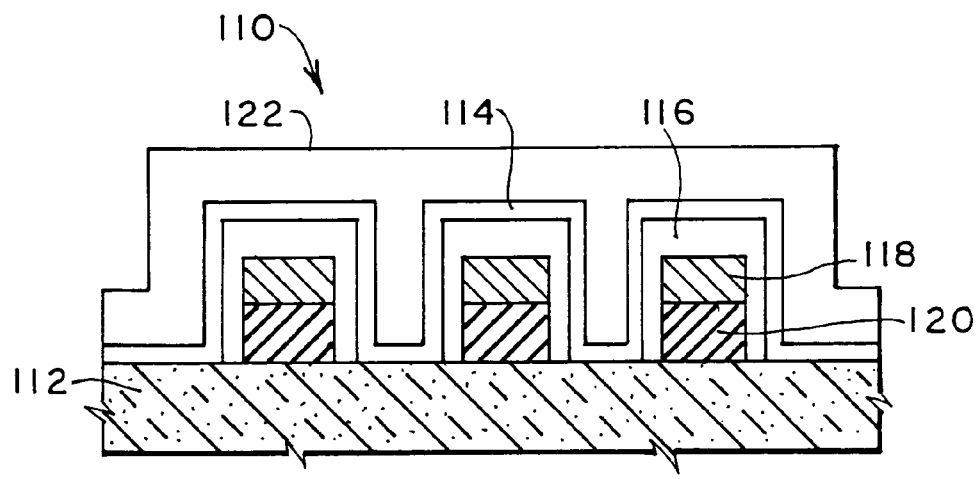
Figure 1C:
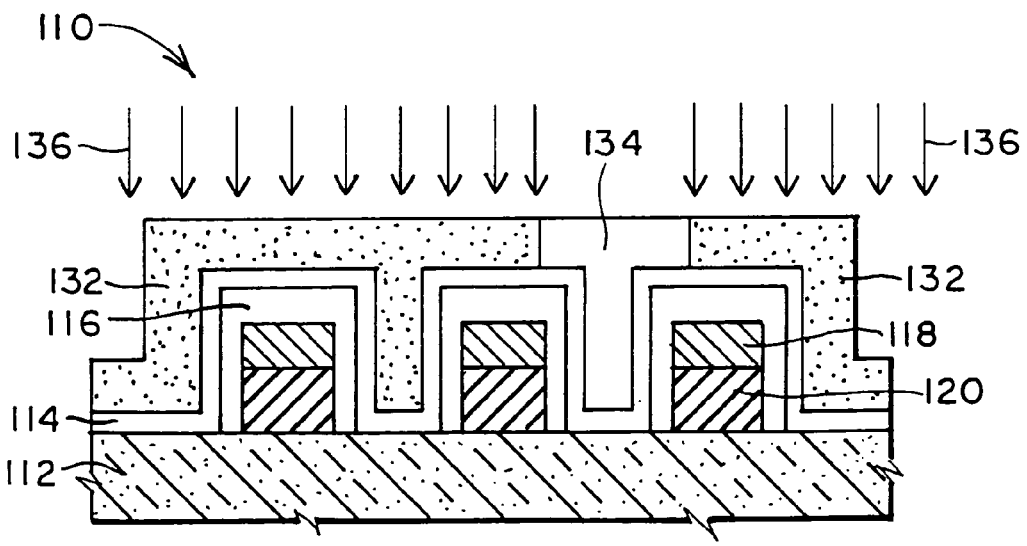
Figure 1D:
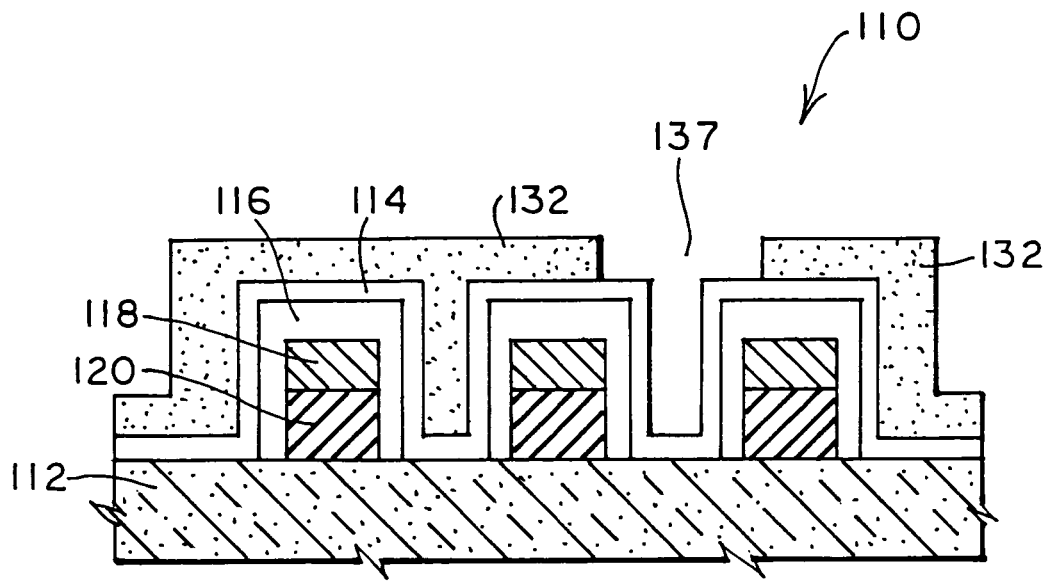
Figure 1E:
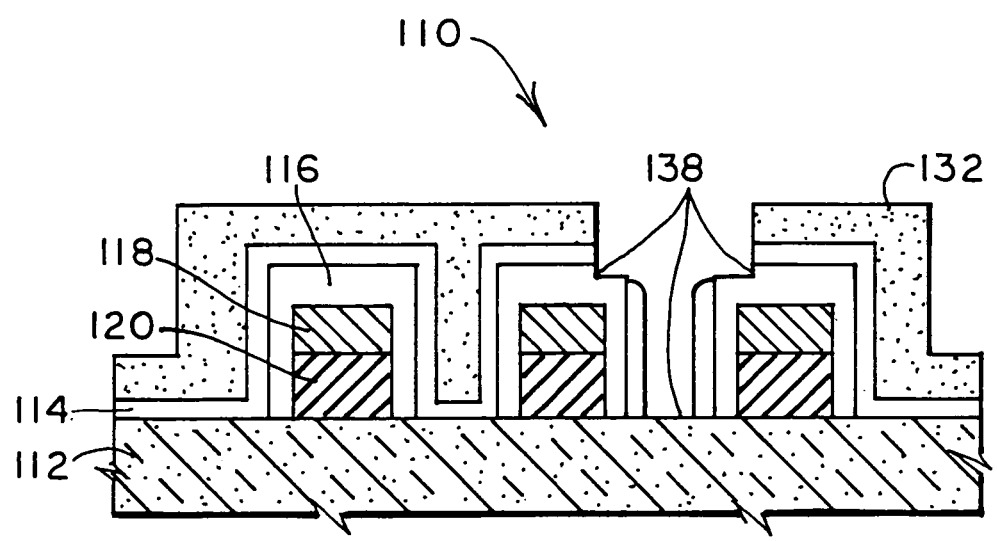

A photo-definable PPMS layer may be utilized to form a self-aligned contact between the gate structures. As shown in FIG. 1b, a PPMS layer 122 may first be formed over the gate structures filling in the gaps between the gate structures. The PPMS layer 122 may then be irradiated with DUV radiation 136 in the presence of oxygen as shown in FIG. 1c. A portion of the PPMS layer 122 may be masked from exposure in a negative pattern scheme (exposed regions are to remain) using well known photo-lithography techniques. As discussed above, the exposed portions 132 of the PPMS layer 122 will be converted to PPMSO. An etch with good selectivity to the PPMSO portions 132 and the underlying secondary insulative layer 114, for example a chlorine or bromine based plasma etch, may then be used to remove the non-exposed portions 134 of PPMS layer 122, as depicted by void 137 in FIG. 1d.

The remaining PPMSO portions 132 may then be used as a hard mask for the self-aligned contact formation. A short oxide punch-through etch may be used to remove exposed portions of the secondary insulative layer 114 to expose a contact area to substrate 112, as shown by etched areas 138 in FIG. 1e. The transformation of the PPMSO portions 132 to silicon oxide may now be completed by ashing in oxygen at an elevated temperature, for example at a temperature greater than 200° C., followed by an anneal in oxygen, for example at about 400° C. Next, the self-aligned contacts may be formed in the etched areas between the gate structures. The contact layer may be polysilicon, copper, aluminum, tungsten silicide, or some other desired conductive contact material.

Figure 2A:
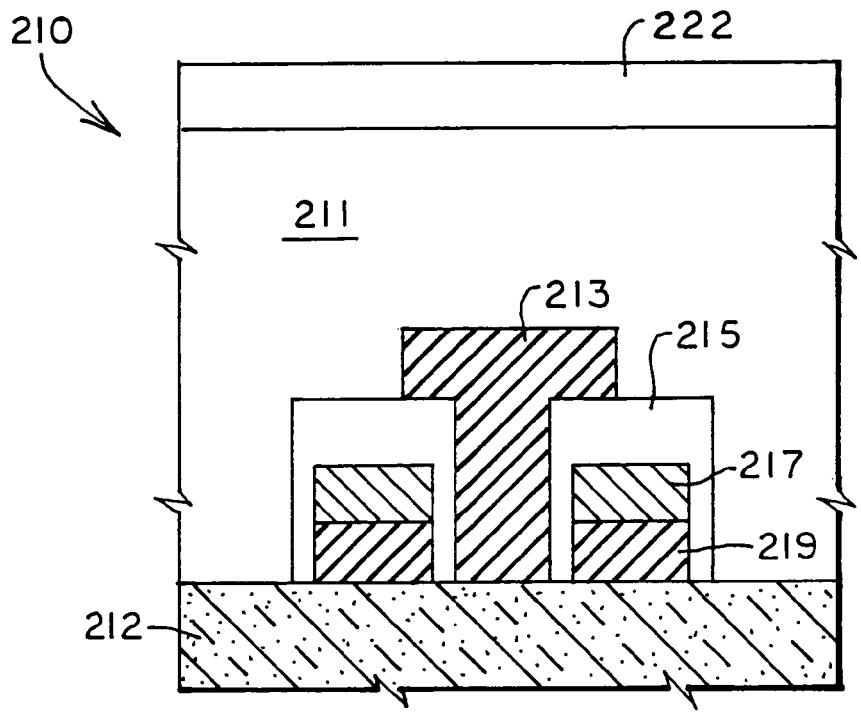
FIGS. 2a–2d show a sequence of structures which exemplify a process of removing a portion of an oxide layer on a substrate.

FIGS. 2a–d show process steps for using a photo-definable PPMS layer as a sacrificial mask layer for a sequential in situ oxide/polysilicon etch in the manufacture of an semiconductor device, such as a DRAM. In FIG. 2a, an integrated circuit structure 210 includes a substrate 212, which may include any desired intervening process layers or structures. The gate structures, which may be part of a DRAM memory cell array, may include a polysilicon layer 219 on top of which may be deposited an optional secondary conductor layer 217, such a tungsten silicide. An insulative layer 215 may be formed around the gate structures, for example, an silicon oxide layer formed by any desired conventional method. A conductive plug 213, for example a polysilicon conductor, may be formed in the contact area between the two gate structures. An additional thicker layer of silicon oxide 211 may be deposited above the conductive plug and gate structures.

Figure 2B:
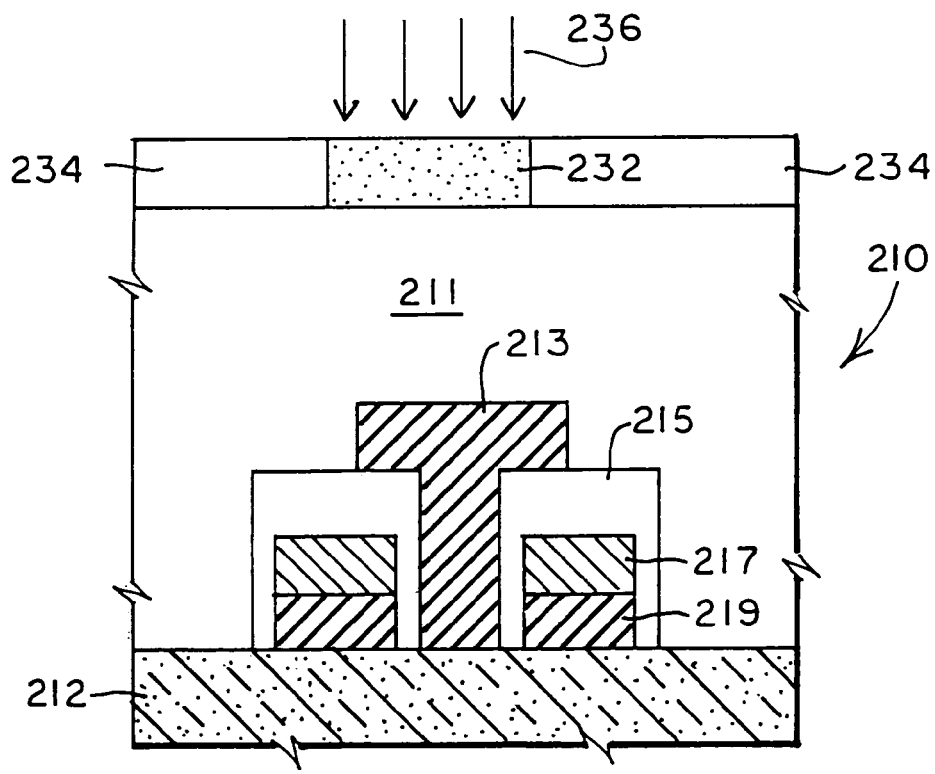

A photo-definable PPMS layer 222 may be deposited on the oxide layer 211. The PPMS layer 222 may then be irradiated with DUV radiation 236 in the presence of oxygen as shown in FIG. 2b. A portion 232 of the PPMS layer 222 may be exposed, while other portions 234 of the PPMS layer 222 may be masked, in a positive pattern scheme (exposed regions are removed) using well known photo-lithography techniques. As discussed above, the exposed portions 232 of the PPMS layer 222 will be converted to PPMSO.

Figure 2C:
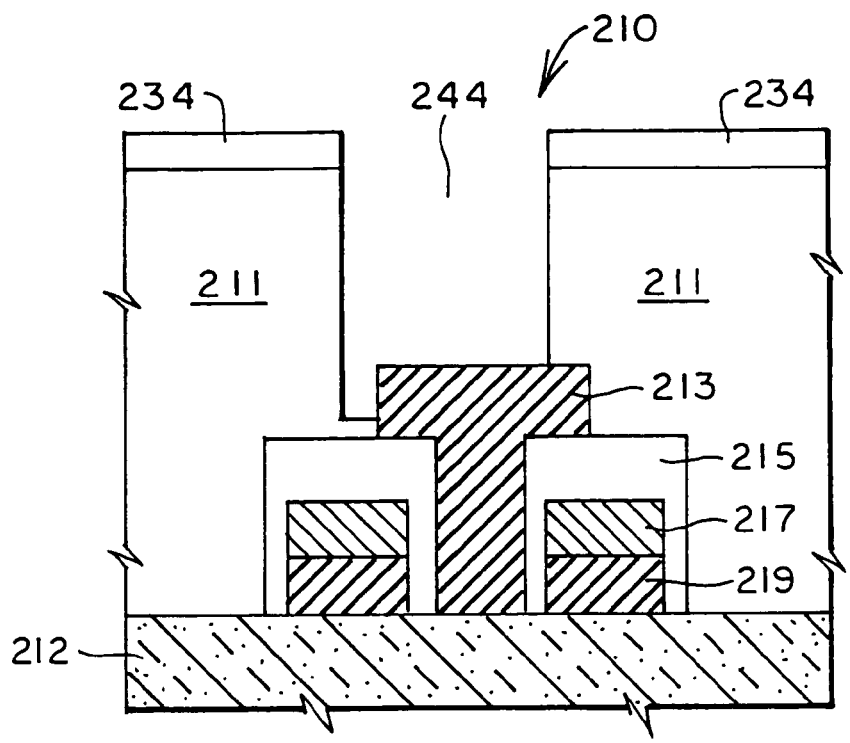
Figure 2D:
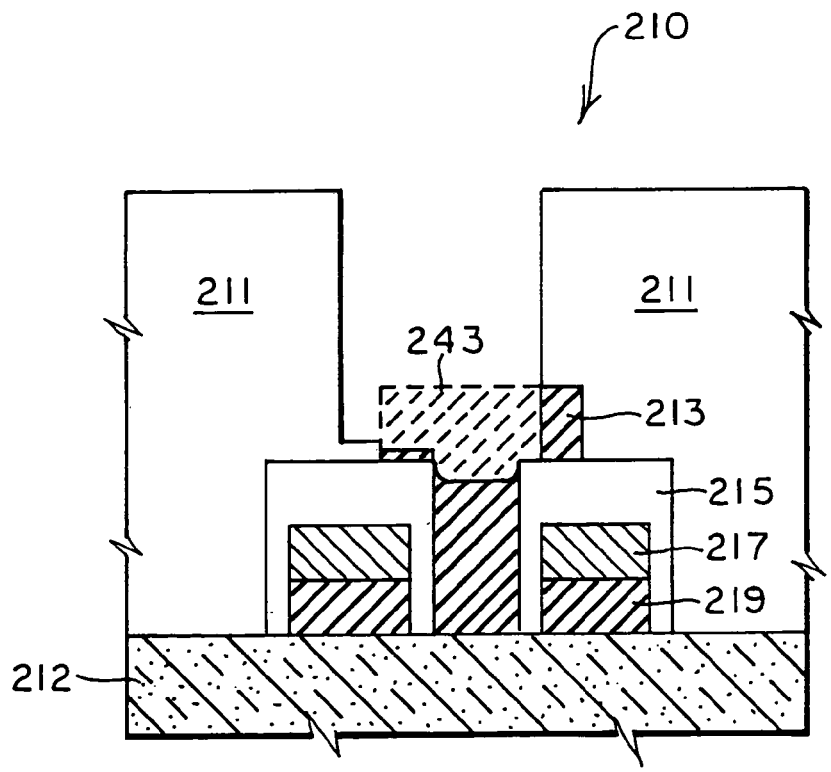

The photo-definable PPMS layer 222 may then be utilized as a sacrificial mask layer in a sequential oxide/polysilicon etch without need for removal from the etching chamber. As shown in FIG. 2c, an oxide etch that has high selectivity to silicon may be used to remove the PPMSO portions 232 and the underlying oxide 211, as shown by void 244 in FIG. 2c. Although some of the PPMS portions 234 may be removed as well, the PPMS portions 234 in effect act as a mask to this oxide etch. To remove a portion of the conductive plug 213, as shown in FIG. 2d, a polysilicon etch step may be used that has good selectivity to oxide, for example a chlorine ($CL_2$) or bromine (HBr) based plasma etch. Phantom line 243 and the cross-hatching therein represents the removed portion of the conductive plug 213. This polysilicon etch step also removes, without need for a further strip, the remaining non-exposed PPMS portions 234, which act as a sacrificial layer. The remaining oxide layer 211 serves as a mask layer for this final etch step.

Figure 3A:
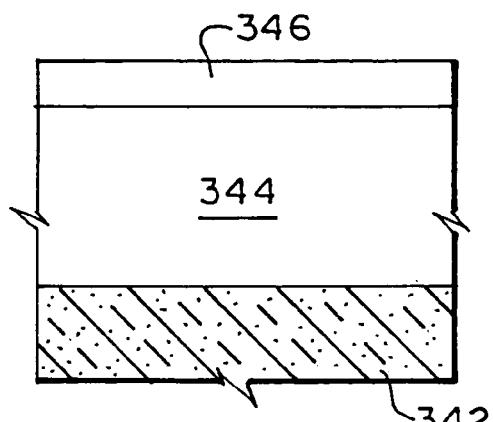
FIGS. 3a–3d show a sequence of structures which employ a photo-definable layer mask which serves to transfer the pattern of a trench to an oxide layer.
Figure 3B:
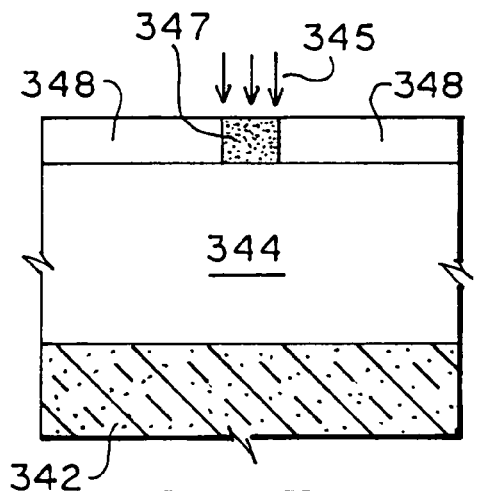

FIGS. 3a–d show process steps for using a photo-definable PPMS layer as a masking material for a single-step oxide dry etch in the manufacture of an integrated circuit, for example a DRAM. In FIG. 3a, a substrate 342 is shown having a silicon oxide layer 344 formed thereon. A PPMS layer 346 may be formed on top of the silicon oxide layer 344. The PPMS layer 346 may then be irradiated with DUV radiation 345 in the presence of oxygen as shown in FIG. 3b. A portion 347 of the PPMS layer 346 may be exposed, while other portions 348 of the PPMS layer 346 may be masked, in a positive pattern scheme (exposed regions are removed) using well known photo-lithography techniques. As discussed above, the exposed portions 347 of the PPMS layer 346 will be converted to PPMSO.

Figure 3C:
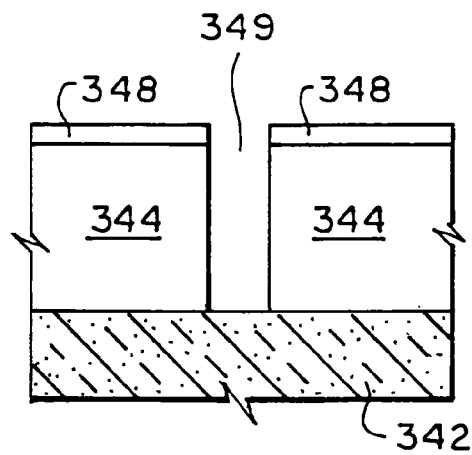
Figure 3D:
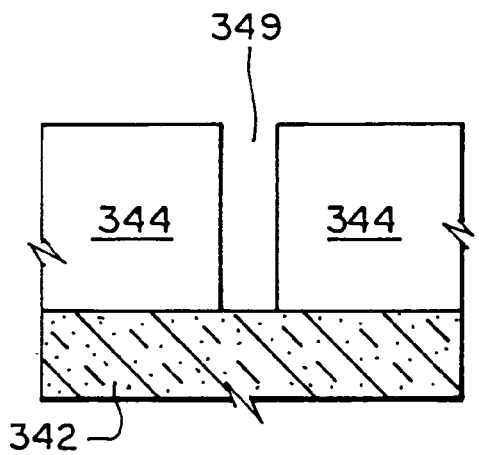

A single-step oxide etch selective to silicon may then be used to form a trench 349, as shown in FIG. 3c. During the oxide etch step, the exposed PPMSO portion 347 is removed first followed by the underlying portion of the oxide layer 344. Thus, the pattern formed in the PPMS layer is transferred through the exposed portion 347 to the oxide layer 344 in a single-step oxide etch. After this etch is completed, the remaining PPMS portions 348 may either be removed or converted to a PPMSO layer through exposure to DUV radiation in the presence of oxygen. If desired, the transformation of the PPMSO layer to silicon oxide may then be accomplished by ashing in oxygen at an elevated temperature, for example at a temperature greater than 200° C., followed by an anneal in oxygen, for example at about 400° C. The non-exposed PPMS layer thereby becomes an additional part of the oxide layer 344, as depicted in FIG. 3d, which may be used as an insulative or dielectric layer.

Figure 4A:
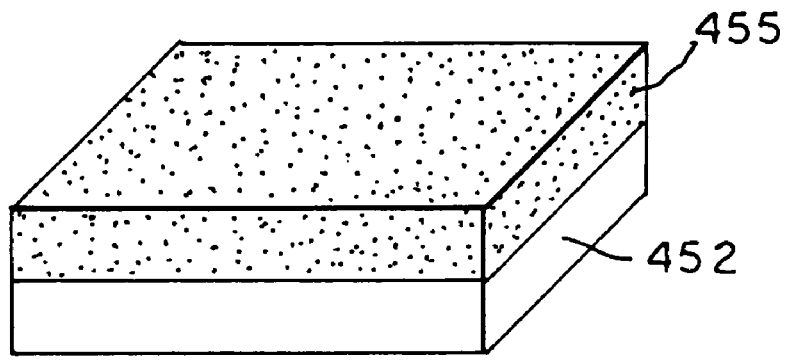
FIGS. 4a–4c show a sequence of three-dimensional structures wherein trenches have been added to a base structure in a Damascene process wherein the photo-definable layer may be left to form an integral part of an oxide layer.
Figure 4B:
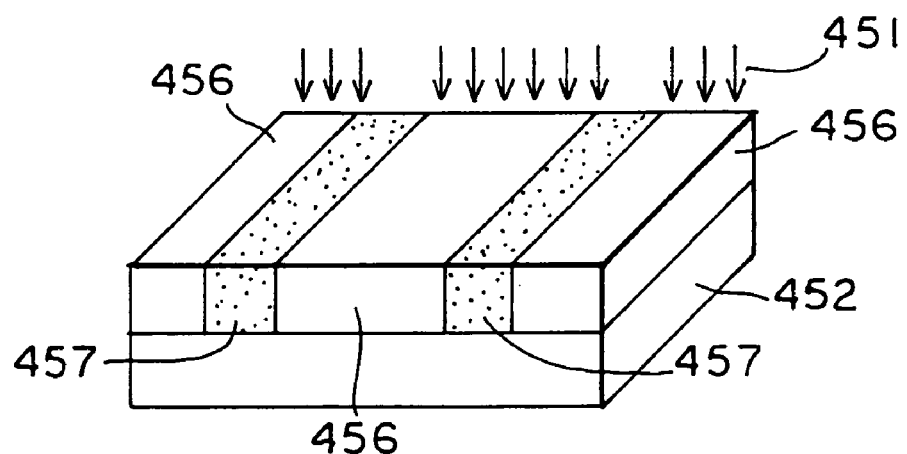
Figure 4C:
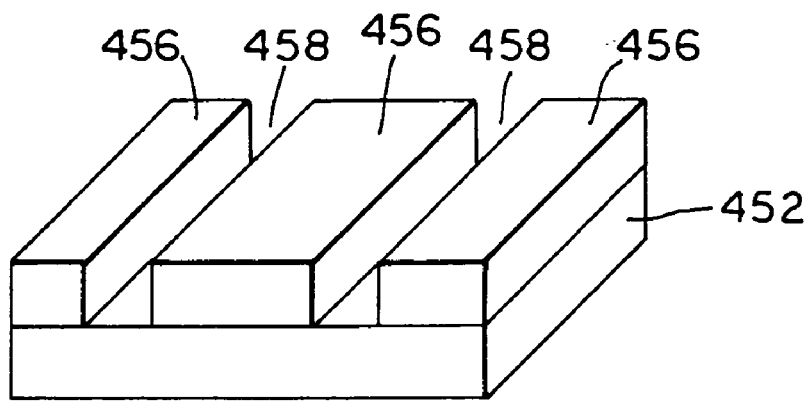

FIGS. 4a–c show process steps for using a photo-definable PPMS layer for a Damascene process in the manufacture of an integrated circuit, for example a DRAM. A Damascene process refers to a process in which a pattern is laid within an existing layer, for example metal interconnects patterned within an insulative layer. In FIG. 4a, an insulative layer 452, for example silicon oxide or a borophosphosilicate glass (BPSG) layer, has been covered with a photo-definable PPMS layer 455. The PPMS layer 455 may then be irradiated with DUV radiation 451 in the presence of oxygen. As shown in FIG. 4b, portions 457 of the PPMS layer 455 may be masked from exposure in a negative pattern scheme (exposed regions are to remain) using well known photo-lithography techniques. The exposed portions 456 of the PPMS layer 455 will be converted to PPMSO, which is an oxide material as described above.

An etch with good selectivity to silicon, for example a chlorine or bromine based plasma etch, may then be used to remove the non-exposed portions 457 of the original PPMS layer 455, as depicted by voids 458 in FIG. 4c. The transformation of the PPMSO portions 456 to silicon oxide may now be completed by ashing in oxygen at an elevated temperature, for example at a temperature greater than 200° C., followed by an anneal in oxygen, for example at about 400° C. To complete the Damascene process, a metal layer may be deposited filling in the voids 458. Furthermore, the steps above may be repeated as desired for additional metal interconnect layers.

Figure 5A:
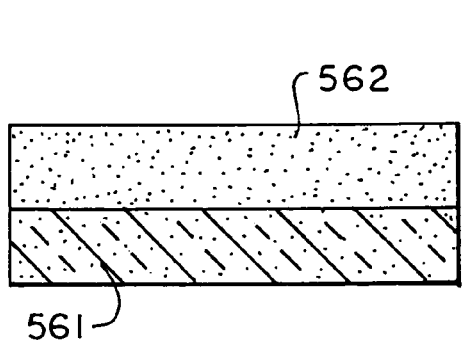
FIGS. 5a–5e show a sequence of cross-sectional views which depict development of contacts and an interconnect pattern in a dual Damascene process.
Figure 5B:
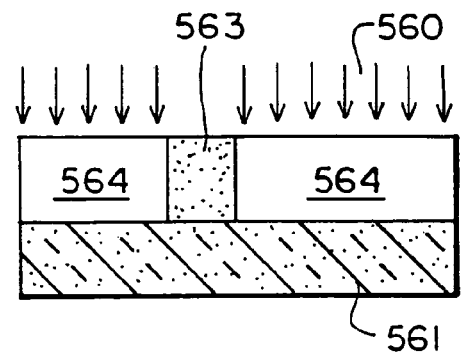

FIGS. 5a–e show process steps for using a photo-definable PPMS layer for a dual Damascene process in the manufacture of an integrated circuit, for example a DRAM. A dual Damascene process is a process in which contacts are made to an underlying conductive layer in a first level, and then a pattern is laid within a second to form patterned metal interconnects. In FIG. 5a, a substrate 561 has been covered with a photo-definable PPMS layer 562. The PPMS layer 562 may then be irradiated with DUV radiation 560 in the presence of oxygen. Portions 563 of the PPMS layer 562 may be masked from exposure in a negative pattern scheme (exposed regions are to remain) using well known photo-lithography techniques. As shown in FIG. 5b, the exposed portions 564 of the PPMS layer 562 will be converted to PPMSO.

Figure 5C:
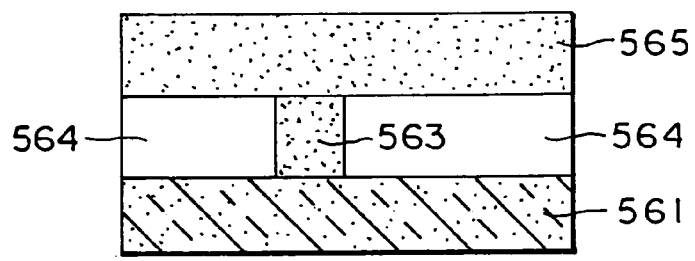
Figure 5D:
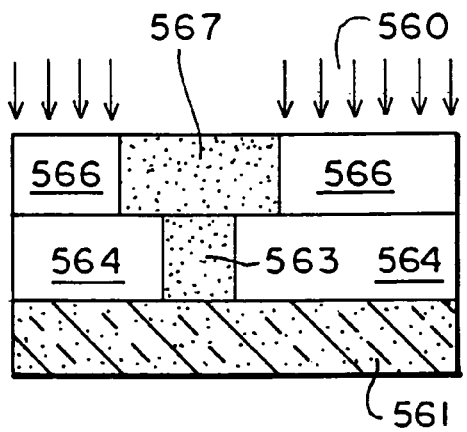

As shown in FIG. 5c, a second photo-definable PPMS layer 565 is formed on top of the first PPMS layer 562. The second PPMS layer 565 may also be irradiated with DUV radiation 560 in the presence of oxygen to convert exposed portions 566 to PPMSO. As with the first layer and as shown in FIG. 5d, portions 567 of the second PPMS layer 565 may be masked from exposure in a negative pattern scheme using well known photo-lithography techniques.

Figure 5E:
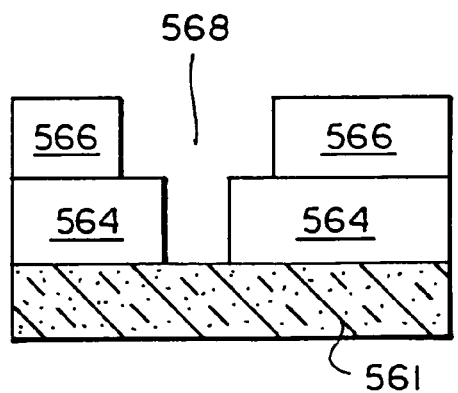

An etch with good selectivity to silicon, for example a chlorine or bromine based plasma etch, may then be used to remove the non-exposed portions 567 of the second PPMS layer 565 and the non-exposed portions 563 of the first PPMS layer 562, as depicted in FIG. 5e. The transformation of the remaining PPMSO portions 564 and 566 to silicon oxide may be completed by ashing in oxygen at an elevated temperature, for example at a temperature greater than 200° C., followed by an anneal in oxygen, for example at about 400° C. To complete the dual Damascene process, a metal layer may be deposited filling in the void 568 left by the removal of portions 563 and 567.

Figure 6A:
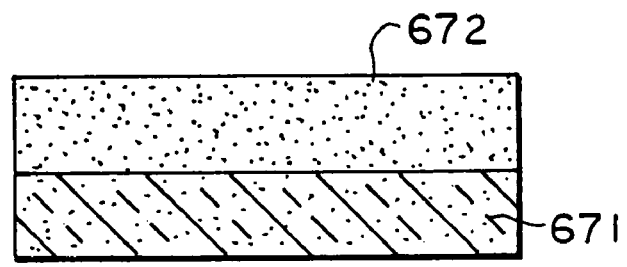
FIGS. 6a–6f show an alternative sequence of cross-sectional views to those shown in FIGS. 5a–5e for a dual Damascene process.
Figure 6B:
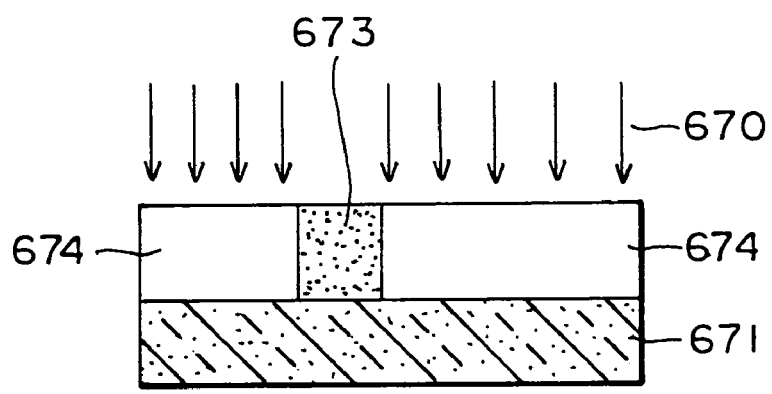

FIGS. 6a–6f show alternative processing steps to those depicted in FIGS. 5a–5e. These alternative steps may be useful, for example, where there are problems with the stability of non-exposed PPMS during subsequent PPMS deposition. In FIG. 6a, a substrate 671 has been covered with a photo-definable PPMS layer 672. The PPMS layer 672 may then be irradiated with DUV radiation 670 in the presence of oxygen. Portions 673 of the PPMS layer 672 may be masked from exposure in a negative pattern scheme (exposed regions are to remain) using well known photo-lithography techniques. As shown in FIG. 6b, the exposed portions 674 of the PPMS layer 672 will be converted to PPMSO.

Figure 6C:
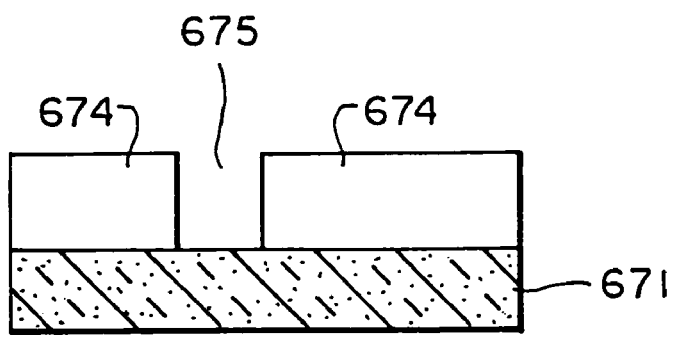
Figure 6D:
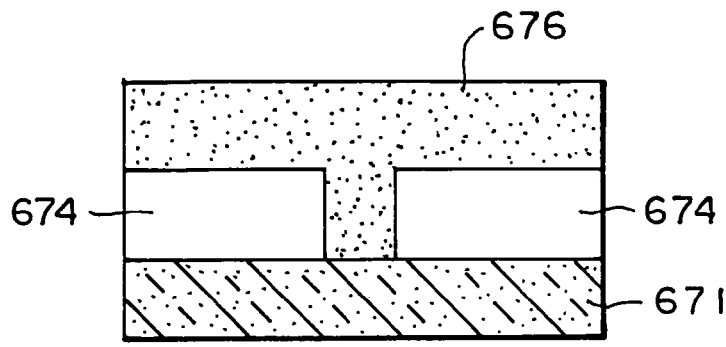
Figure 6E:
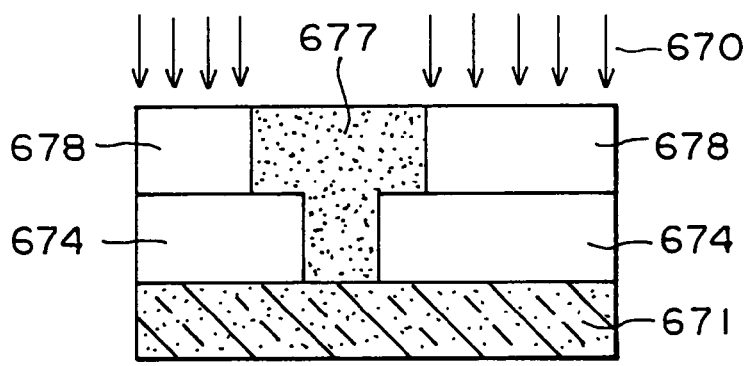
Figure 6F:
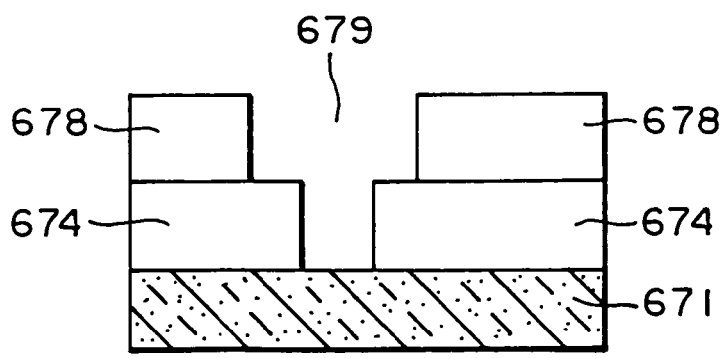

In contrast to FIGS. 5a–e, the non-exposed portion 673 may be removed using an etch with good selectivity to silicon to create void 675 as shown in FIG. 6c. After the non-exposed portions are removed, a second photo-definable PPMS layer 676 may be formed on top of the first PPMS layer 672 as shown in FIG. 6d. The second PPMS layer 676 may then be irradiated with DUV radiation 670 in the presence of oxygen to convert exposed portions 678 to PPMSO. As with the first layer and as shown in FIG. 6e, portions 677 of the second PPMS layer 676 may be masked from exposure in a negative scheme using well known photo-lithography techniques. An etch with good selectivity to silicon, for example a chlorine or bromine based plasma etch, may now be used to remove the non-exposed portions 677 of the second PPMS layer 676 to create void 679, as depicted in FIG. 6f. The transformation of the remaining PPMSO portions 674 and 678 to silicon oxide may be completed by ashing in oxygen at an elevated temperature, for example at a temperature greater than 200° C., followed by an anneal in oxygen, for example at about 400° C. To complete the dual Damascene process, a metal layer may be deposited filling in the voids left by the removal of portions 674 and 678.

Figure 7A:
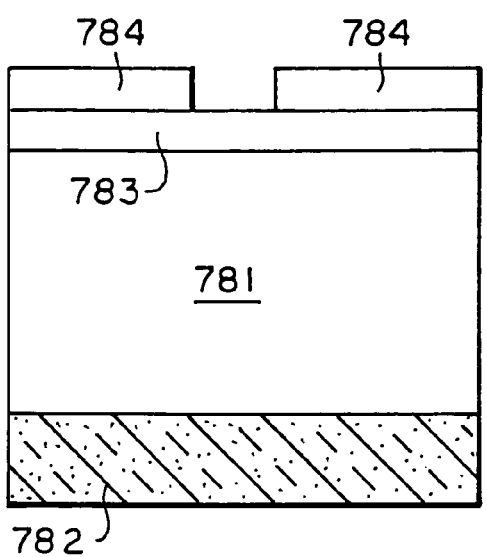
FIGS. 7a–7d show a sequence of structures wherein a photo-definable layer is used along with a conventional photoresist as a mask in the formation of a contact through an oxide layer.

FIGS. 7a–d show process steps according to the present invention for using a photo-definable PPMS layer as an underlying layer in conjunction with an organic photoresist in the formation of a contact in the manufacture of an integrated circuit, for example a DRAM. Referring to FIG. 7a, a substrate 782 is shown having a dielectric layer 781, for example a silicon oxide layer. A PPMS layer 783 may be formed on the dielectric layer 781. A patterned photoresist layer 784, which has been coated, exposed, and developed, may be formed on the PPMS layer 783. This photoresist layer 784 may be formed using standard photolithography techniques. The photoresist layer 784 may be a conventional organic resist and may be applied using standard procedures. The underlying PPMS layer allows a thinner organic photoresist layer to be used.

Figure 7B:
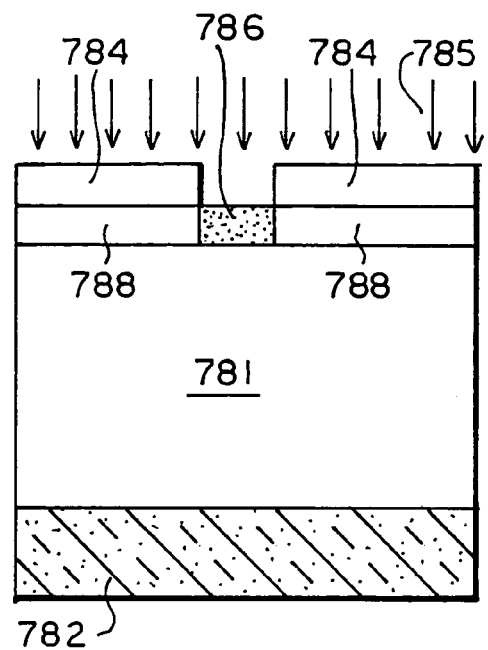
Figure 7C:
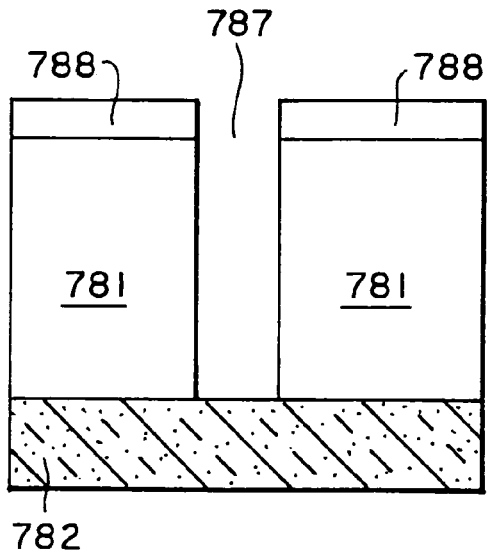
Figure 7D:
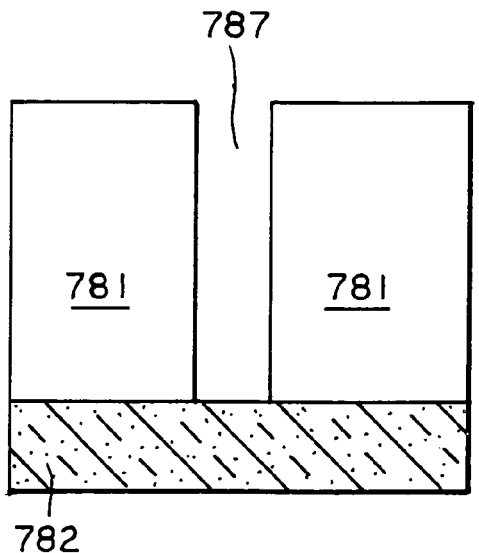

The exposed portion 786 of the PPMS layer 783, as well as the photoresist layer 784, may then be irradiated with DUV radiation 785 in the presence of oxygen as shown in FIG. 7b. The exposed portion 786 of the PPMS layer 783 will be converted to PPMSO, and the photoresist layer 784 is simultaneously cross-linked and thereby hardened. Alternatively, the cross-linking of the photoresist may occur in a discrete step. Next, an oxide etch that has high selectivity to silicon, for example a chlorine or bromine based plasma etch, may be used to remove the exposed PPMSO portions 786 and the underlying oxide within dielectric layer 781, as depicted by void 787 in FIG. 7c. Any remaining photoresist may then be stripped. The remaining non-exposed PPMS portions 788 may then be converted to PPMSO through exposure to DUV radiation in the presence of oxygen. The conversion of the PPMSO layer to silicon oxide may be completed by ashing in oxygen at an elevated temperature, for example at a temperature greater than 200° C., followed by an anneal in oxygen, for example at about 400° C. In the resulting structure, as shown in FIG. 7d, the PPMS layer has become an integral part of the dielectric layer 781.

The PPMS layers described above may be formed using, for example, a conventional parallel plate radio frequency (RF) plasma reactor. In such a system, methylsilane gas, optionally diluted with inert gas, may be introduced and deposited through a room temperature RF plasma polymerization. The deposition of the PPMS may be conducted at a variety of conditions, depending on factors such as the presence, concentration, and type of dilutant gas, the type and concentration of methylsilane gas, desired quantity and depth of the resulting PPMS layer, the type of substrate, applicable flow rates, and the RF power. Generally, overall pressure in the deposition chamber may be in the range from about 10 mTorr to about 1,000 mTorr.

The PPMS may be developed by exposure to DUV radiation in the presence of oxygen to convert the PPMS to the oxidized form PPMSO. In addition, an oxygen plasma stripper may be used to convert PPMSO to a low density silicon oxide ($SiO_2$) followed by a consolidation step to remove residual hydrogen and form a denser oxide layer. Such oxygen plasma strips may be conducted in conventional equipment under standard conditions, including for example at temperatures of above about 200° C. Consolidation may be performed by a variety of conventional techniques, such as for example by annealing at temperatures of about 400° C. The conversion of the oxide-like photo-definable layer to a silicon oxide layer allows greater process flexibility than traditional organic photoresists, because the resulting oxide layer may be left on the semiconductor substrate to perform any number of desired functions for which insulative layers may be utilized.

The photo-definable layer may be deposited at a variety of thicknesses. Desired thickness may vary depending on a number of factors including the type, duration, and severity of the wet or dry development step involved, and the material chosen for the photo-definable layer, as well as the desired structure of the final product. Typical deposition thickness values may range from about 500 Angstroms (A) to about 5000 A.

It is noted that techniques for depositing the photo-definable layer and for converting the photo-definable layer to an insulative form will likely vary depending on the material selected for the photo-definable layer. For example, depending upon the photo-definable material, a wide variety of conventional techniques may be employed, including for example conventional techniques used for chemical vapor deposition, sputter coating, spin coating, spraying, and plasma deposition. Similarly, the conversion process will likely vary. While some materials may be directly converted to an insulative material through exposure to electro-magnetic radiation alone, other materials may require temperature variations, pressure variations, catalysts, or the presence of additional reactants, including for example oxygen-containing materials. In addition, the particular removal step employed may vary depending on the particular photo-definable layer used and may include wet or dry removal techniques.

Further modifications and alternative embodiments of this invention will be apparent to those skilled in the art in view of this description. For example, the use of PPMS as the material for the photo-definable layers in the examples depicted and discussed with respect to the drawings is for illustrative purposes, and it will be recognized that the present invention is not so limited. Accordingly, this description is to be construed as illustrative only and is for the purpose of teaching those skilled in the art the manner of carrying out the invention. It is to be understood that the forms of the invention herein shown and described are to be taken as presently preferred embodiments. Equivalent elements or materials may be substituted for those illustrated and described herein, and certain features of the invention may be utilized independently of the use of other features, all as would be apparent to one skilled in the art after having the benefit of this description of the invention.

What is claimed is:

1. A process for using a photo-definable layer in a negative mask scheme to manufacture a semiconductor device, comprising:
   forming over a substrate a photo-definable layer that is convertible to an insulative material;
   exposing selected portions of said photo-definable layer to electro-magnetic radiation in a negative pattern scheme to convert said selected portions to an insulative material;
   removing non-exposed portions of said photo-definable layer with an etch process that is selective to exposed portions of said photo-definable layer;
   using said exposed portions of said photo-definable layer as a patterned etch mask for further processing steps;
   leaving said exposed portions of said photo-definable layer as an insulative layer within said semiconductor device after completion of the use of said exposed portions of said photo-definable layer as a patterned etch mask; and
   converting said insulative layer to an oxide layer through exposure to an oxygen plasma after said leaving step.

2. The process of claim 1, wherein said photo-definable layer comprises an organosilicon resist.

3. The process of claim 2, wherein said photo-definable layer comprises plasma polymerized methylsilane (PPMS) and said insulative material comprises photo-oxidized siloxane (PPMSO).

4. The process of claim 2, wherein said photo-definable layer comprises plasma polymerized methylsilane (PPMS).

5. A process of using a photo-definable layer in a Damascene process to create a patterned structure, comprising:
   forming on a substrate a photo-definable layer that is convertible to an insulative material;
   exposing selected portions of said photo-definable layer to electro-magnetic radiation to convert said selected portions to an insulative material;
   removing non-exposed portions of said photo-definable layer with an etch process that is selective to exposed portions of said photo-definable layer to form a desired pattern within said exposed portions of said photo-definable layer;
   leaving said exposed portions of said photo-definable layer on said substrate as an insulative layer after completion of the use of said exposed portions of said photo-definable layer as a patterned etch mask; and
   converting said insulative layer to an oxide layer through exposure to an oxygen plasma after said leaving step.

6. The process of claim 5, wherein said photo-definable layer comprises an organosilicon resist.

7. The process of claim 6, wherein said photo-definable layer comprises plasma polymerized methylsilane (PPMS) and said insulative material comprises photo-oxidized siloxane (PPMSO).

8. The process of claim 7, further comprising consolidating said oxide layer with an anneal.

9. The process of claim 8, further comprising depositing a conductive material within said pattern.

10. The process of claim 9, wherein said conductive material forms an interconnect structure within a semiconductor memory device.

11. The process of claim 5, wherein said exposing step is performed by irradiating said selected portions of said photo-definable layer with ultraviolet light in the presence oxygen.

12. The process of claim 11, wherein said non-exposed portions of said photo-definable layer are removed using a chlorine-based or a bromine-based plasma etch.

13. The process of claim 5, further comprising forming a conductive layer inlaid within the oxide layer.

14. The process of claim 13, wherein said conductive layer forms an interconnect structure within a semiconductor memory device.

* * * * *